(12) United States Patent
Yeung (10) Patent No.: US 7,031,868 B2
(45) Date of Patent: Apr. 18, 2006

(54) METHOD AND APPARATUS FOR PERFORMING TESTING OF INTERCONNECTIONS

(75) Inventor: Philip Yeung, Mountain View, CA (US)

(73) Assignee: Rambus, Inc., Los Altos, CA (US)

( * ) Notice: Subject to any disclaimer, the term of this patent is extended or adjusted under 35 U.S.C. 154(b) by 84 days.

(21) Appl. No.: 10/663,572

(22) Filed: Sep. 15, 2003

(65) Prior Publication Data

US 2005/0060116 A1 Mar. 17, 2005

(51) Int. Cl.
*G01R 27/28* (2006.01)
*G01R 31/00* (2006.01)
*G11C 29/00* (2006.01)

(52) U.S. Cl. .................. 702/120; 702/59; 714/720
(58) Field of Classification Search ............. 702/120, 702/58, 59, 122, 123, 117; 365/201, 63; 714/720, 722, 733
See application file for complete search history.

(56) References Cited

U.S. PATENT DOCUMENTS

| | | | |
|---|---|---|---|
| 5,621,741 A | 4/1997 | Kohiyama | |
| 6,208,571 B1 | 3/2001 | Ikeda et al. | |
| 6,505,317 B1 | 1/2003 | Smith et al. | |
| 6,609,221 B1* | 8/2003 | Coyle et al. | 714/715 |
| 6,885,209 B1* | 4/2005 | Mak et al. | 324/763 |
| 2004/0117709 A1 | 6/2004 | Nejedlo et al. | |

FOREIGN PATENT DOCUMENTS

WO WO 00/39218 8/1999

* cited by examiner

Primary Examiner—Bryan Bui
Assistant Examiner—Meagan S Walling
(74) Attorney, Agent, or Firm—Morgan, Lewis & Bockius LLP (57) ABSTRACT

The present invention provides a method and apparatus configured to allow testing of interconnections between components in a system. The present invention utilizes a source of a known pattern, for example a pattern buffer, in a first component of the system and a capture buffer located in a second component of the system.

35 Claims, 6 Drawing Sheets

METHOD AND APPARATUS FOR PERFORMING TESTING OF INTERCONNECTIONS

CROSS-REFERENCE TO RELATED APPLICATIONS

BACKGROUND OF THE INVENTION (1) Field of the Invention

The invention relates to the testing of electronic equipment.

(2) Description of the Related Art

In the manufacturing of electronic equipment, it is beneficial to test the proper operation of the manufactured equipment in order to maintain an expected level of quality. Testing may be performed on individual electronic components, subsystems, and complete systems. Since testing of subsystems and systems involves testing of interconnections between components, techniques have been developed to facilitate such testing.

One example of a technique for testing of interconnections between components is referred to as boundary scan. Boundary scan involves providing registers and supporting circuitry in components in accordance with an established boundary scan standard, such as Institute of Electrical and Electronics Engineers, Inc. (IEEE) Standard 1149.1, which was developed based on a proposal by the Joint Test Action Group (JTAG). A component with provisions for boundary scan may be configured using a test access port (TAP) to output or receive as input digital signals on the input/output (I/O) pins of the component. The TAP includes five pins consisting of the following: a test data input (TDI), a test data output (TDO), a test mode select (TMS), a test clock (TCK), and a test reset (TRST). Testing of an interconnection between two components is accomplished by configuring a first component to output a signal of a specified logic level and configuring a second component to receive as an input that signal and to identify the received logic level of that signal. An external test controller compares the logic level of the output signal with the received logic level of the input signal to determine if the interconnection between the components is passing the signal properly. The registers provided for boundary scan are configured to operate as shift registers, allowing the data of the output signal and the input signal to be shifted through the boundary scan chain, both within a component and among several components.

However, as the data rates with which components communicate increase, the ability to provide for boundary scan testing becomes increasingly difficult. Yet, such increased data rates require even higher standards of performance from the interconnections for which such testing is frustrated. Without an effective testing technique, assembly yield would be decreased, and total manufacturing cost would be increased. Also, some IC devices, such as memory devices, often don't support the additional pins due to package and silicon cost and complexity associated with the boundary scan macro. Thus, a technique is needed to provide a capability of advanced testing in modern electronic equipment.

BRIEF DESCRIPTION OF THE SEVERAL VIEWS OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE INVENTION

The present invention provides a method and apparatus configured to allow testing of interconnections between components in a system. The present invention utilizes a source of a known pattern, for example a pattern buffer, in a first component of the system and a capture buffer located in a second component of the system. The present invention avoids the need to introduce additional logic circuitry in line with existing input and output paths and avoids additional electrical loading of critical input and output circuitry, thereby avoiding the performance limitations that can be introduced by the introduction of such circuitry. Also, embodiments of the present invention can allow more rapid testing of systems by avoiding long chains of shift registers in series with the testing path. Also, embodiments of the present invention may be implemented to avoid the specific pin requirements mandated by the boundary scan technique, allowing the use of fewer pins and the possibility of reusing existing pins, for example, existing pins for implementing an existing communication path independent of the interconnections being tested, such as a serial link.

Moreover, embodiments of the present invention may be particularly suitable for use in memory systems, both because of the performance penalties that would be incurred in memory systems by attempts to implement prior art testing techniques and by the benefits to be achieved by providing an efficient technique for testing the typically large number of interconnect conductors found in memory systems.

Embodiments of the present invention are useful in that they are capable of providing "at speed" wire testing, in other words, being able to test interconnections using signals having similar alternating-current (AC) characteristics, including frequency, as signals intended to be present during normal operation of such devices.

Figure 1:
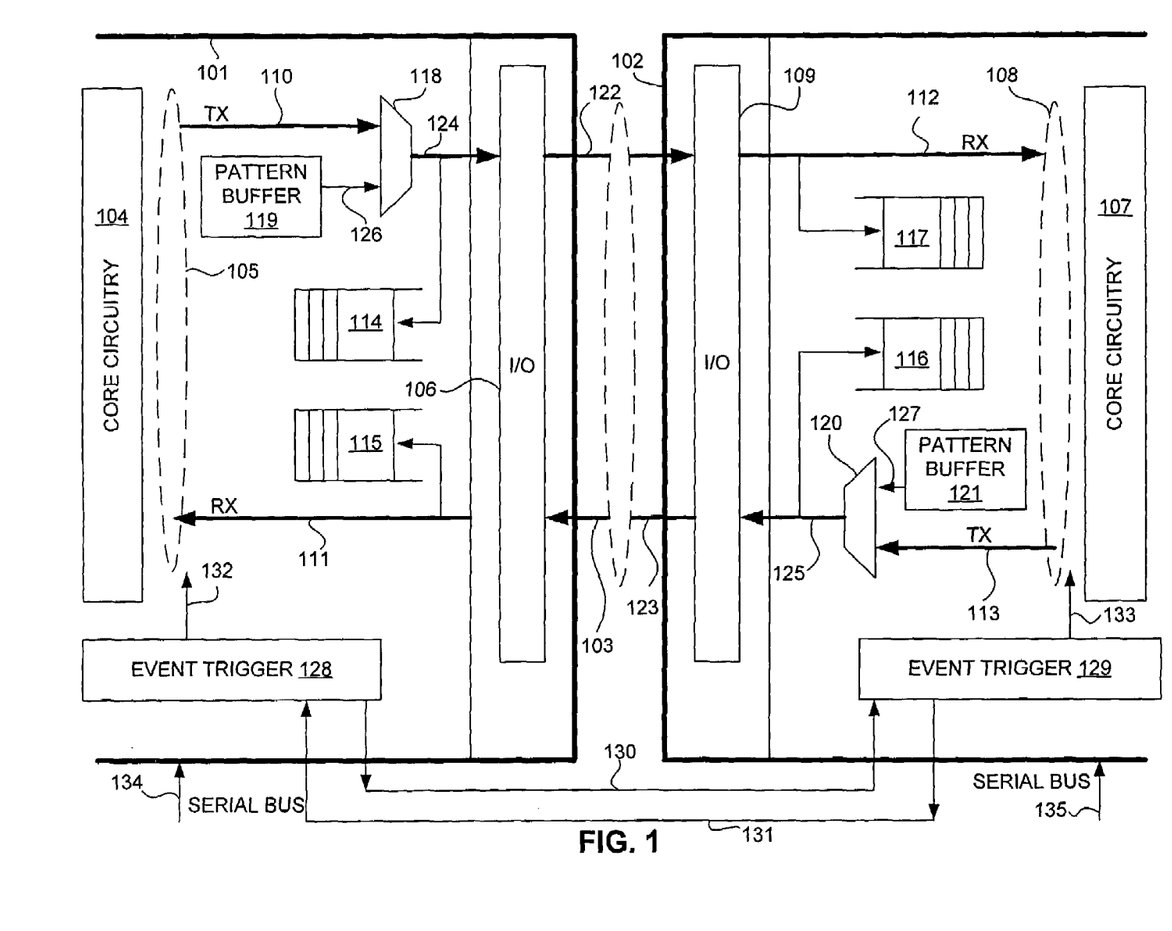
FIG. 1 is a block diagram illustrating a system configured to allow interconnect testing in accordance with an embodiment of the present invention.

FIG. 1 is a block diagram illustrating a system configured to allow interconnect testing in accordance with an embodiment of the present invention. The system comprises a first component 101 coupled to a second component 102 via interconnection 103. First component 101 comprises a first core circuitry 104, a first interface circuitry 106, and a first communication path 105 coupling first core circuitry 104 to first interface circuitry 106. Second component 102 comprises second core circuitry 107 coupled to second interface circuitry 109 via second communication path 108. First interface circuitry 106 of first component 101 is coupled to interconnection 103 and provided communication to second component 102 via interconnection 103. Second interface circuitry 109 of second component 102 is coupled to interconnection 103 and provides communication with first component 101 via interconnection 103.

In at least one embodiment, interconnection 103 comprises interconnection 122, which is configured to communication information from first component 101 to second component 102, and second interconnection 123, which is configured to communication information from second component 102 to first component 101. In at least one embodiment, first communication path 105 comprises first transmit communication path 110 and first receive communication path 111. First transmit communication path 110 may include first multiplexer 118, which is configured to select an input from among first transmit communication path 110 and input 126, which is coupled to an output of pattern buffer 119. Multiplexer 118 provides an output at node 124, which is a continuation of first transmit communication path 110. First transmit capture buffer 114 is coupled to node 124 or, in the absence of multiplexer 118, to first transmit communication path 110. First receive capture buffer 115 is coupled to first receive communication path 111.

In at least one embodiment, second communication path 108 comprises second receive communication path 112 and second transmit communication path 113. Second transmit communication path 113 may comprise multiplexer 120, which is configured to select an input from among second transmit communication path 113 and input 127, which is coupled to second pattern buffer 121. Second multiplexer 120 provides an output at node 125, which is a continuation of second transmit communication path 113. Second transmit capture buffer 116 is coupled to node 125, or in the absence of multiplexer 120, to second transmit communication path 113. Second receive capture buffer 117 is coupled to second receive communication path 112.

In at least one embodiment, first component 101 includes first event trigger circuitry 128, which provides first buffer control signal 132. First buffer control signal 132 is coupled to at least one of first pattern buffer 119, first transmit capture buffer 114, and first receive capture buffer 115 and may be used to control one or more of these elements. In at least one embodiment of the present invention, second component 102 comprises second event trigger circuitry 129, which provides second buffer control output 133. Second buffer control output 133 is coupled to at least one of second pattern buffer 121, second transmit capture buffer 116, and second receive capture buffer 117 and may be used to control one or more of these elements. First event trigger circuitry 128 of first component 101 and second event trigger circuitry 129 of second component 102 may be coupled by a serial link, such as a bidirectional serial link or unidirectional serial links. Examples of unidirectional links include unidirectional link 130 and unidirectional link 131. Such links may be used to coordinate operation of first component 101 and second component 102 for interconnection testing. First component 101 and second component 102 may also be provided with other links, for example link 134 and link 135. In at least one preferred embodiment, some or all of links 130, 131, 134, and 135 are implemented as serial links. Serial links typically minimize the complexity of the interconnections, thereby increasing reliability, which can provide a more robust way to bootstrap testing of other, typically more complex, interconnections.

During normal operation, first core circuitry 104 of first component 101 sends information over first transmit communication path 110, through multiplexer 118 and node 124, to first interface circuitry 106. First interface circuitry 106 transmits the information over interconnection 122 to second interface circuitry 109 of second component 102. From second interface circuitry 109, the information is sent over second receive communication path 112 to second core circuitry 107. Likewise, second core circuitry 107 of second component 102 sends information over second transmit communication path 113, through multiplexer 120 and node 125, to second interface circuitry 109. Second interface circuitry 109 transmits the information via interconnection 123 to first interface circuitry 106 of first component 101. First interface circuitry 106 sends the information over first receive communication path 111 to first core circuitry 104. However, for such normal operation to be possible, interconnections 122 and 123 must be free of faults that would prevent such communication. Thus, interconnections 122 and 123 may be tested, in accordance with one or more embodiments of the present invention.

To perform testing of interconnection 103 or portions thereof, a test pattern is provided at node 124 of first component 101. First pattern buffer 119 may be loaded with a first pattern, which is then output via input 126 of first multiplexer 118 so that it may be provided at node 124. The first pattern present at node 124 is provided to first interface circuitry 106, which transmits the first pattern via interconnection 122 to second interface circuitry 109 of second component 102. Second interface circuitry 109 passes the pattern to second receive communication path 112, which allows reception by second receive capture buffer 117.

Optionally, testing of interconnections in an opposite direction, such as testing of interconnection 123, may be accomplished either simultaneously with the testing of interconnection 122 or at a different time. To perform such testing, a second pattern is provided at node 125. Such a pattern may be provided by loading the second pattern into second pattern buffer 121, which provides the second pattern to input 127 of multiplexer 120. Multiplexer 120 is configured to pass the second pattern to node 125, which provides the second pattern to second interface circuitry 109. Second interface circuitry 109 transmits the second pattern via interconnection 123 to first interface circuitry 106 of first component 101. First interface circuitry 106 passes the information to the second pattern to first receive communication path 111, which allows reception of the second pattern at first receive capture buffer 115.

For the interconnection testing to be meaningful, information sufficient to convey meaningful detail of the captured first pattern in second receive capture buffer 117 with the first pattern as transmitted by first interface circuitry 106 needs to be brought together for comparison. In one embodiment, information pertaining to the captured first pattern in second receive capture buffer 117 may be communicated to first component 101 for example, via interconnection 123, link 131, or link 135, for comparison in first component 101 or to another component for comparison. Alternatively, information pertaining to the first pattern transmitted from first interface circuitry 106 may be communicated to second component 102 via a path other than interconnection 122, for example serial link 130 or serial link 134, for comparison at second component 102, or may be communicated to another component for comparison.

Likewise, information pertaining to the second pattern transmitted from second interface circuitry 109 needs to be assembled at a common location with information pertaining to the captured second pattern in first receive capture buffer 115 to allow comparison. The entire captured or transmitted pattern may be communicated for comparison, or some other representative information, for example a value calculated from the captured or transmitted pattern, such as a cyclical redundancy check (CRC) value or other check sum value, may be communicated and used for comparison.

Figure 2:
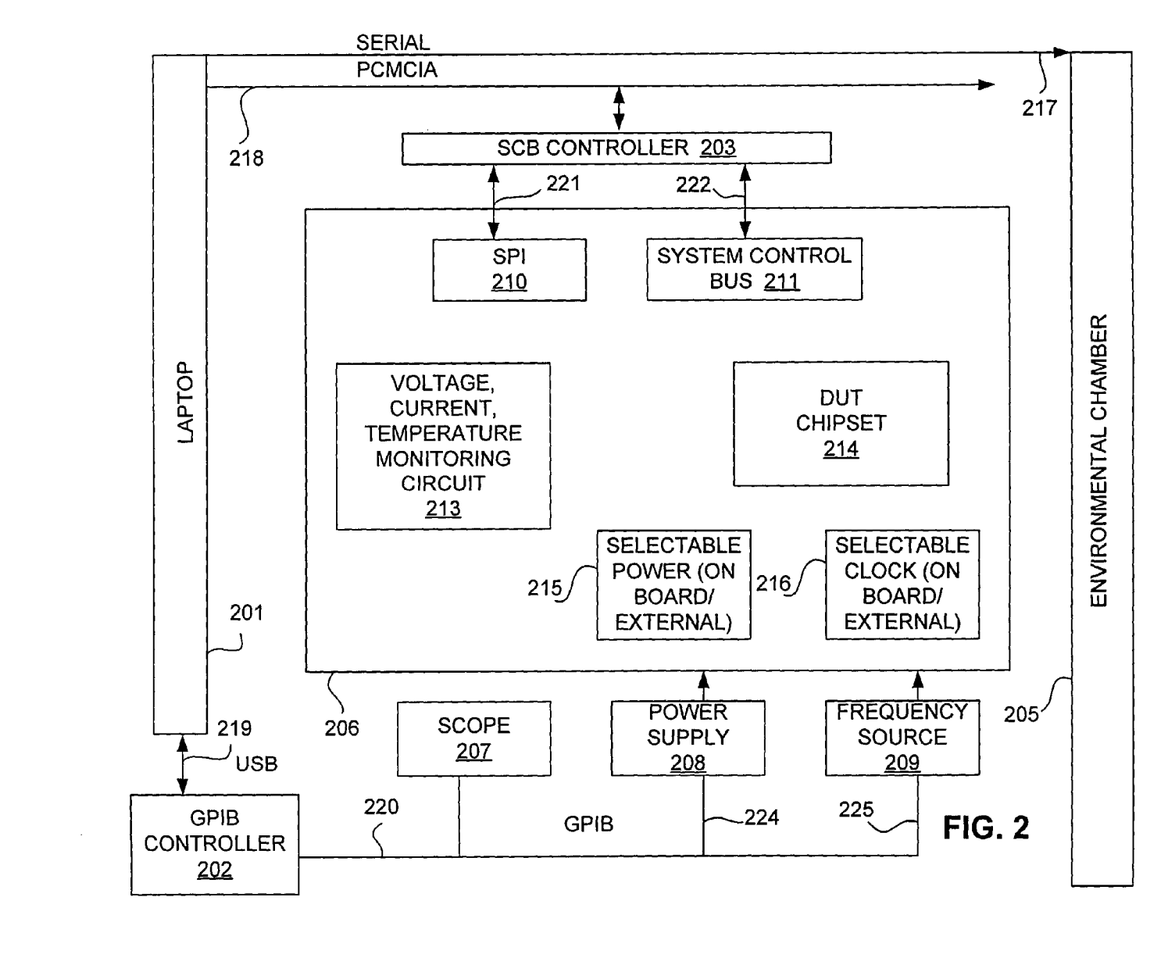
FIG. 2 is a block diagram illustrating a testing environment within which one or more embodiments of the present invention may be practiced.

FIG. 2 is a block diagram illustrating a testing environment within which one or more embodiments of the present invention may be practiced. The testing environment comprises computer 201, General Purpose Interface Bus (GPIB) controller 202, serial control link (SCB) controller 203, environmental chamber 205, testing subsystem 206, oscilloscope 207, power supply 208, frequency source 209, serial peripheral interface (SPI) 210, system control bus 211, voltage current and temperature monitoring circuit 213, device-under-test chipset 214, selectable power interface 215, and selectable clock interface 216.

Computer 201 is coupled via serial link 217 to environmental chamber 205, which controls environmental conditions, for example, temperature and humidity, of testing subsystem 206. Computer 201 is coupled via PCMCIA interface 218 to system control bus controller 203. System control bus controller 203 is coupled via serial interface 221 to SPI 210 of testing subsystem 206. Serial control bus controller 203 is coupled via bus 222 to system control bus 211. Computer 201 is coupled via universal serial bus (USB) 219 to GPIB controller 202.

GPIB controller 202 is coupled via GPIB 220 to oscilloscope 207, power supply 208, and frequency source 209. Oscilloscope 207 may be selectively coupled to any points within testing subsystem 206 for which electrical measurements may be desirable, for example test points within DUT chipset 214. Power supply 208 may be controlled by GPIB controller 202 to provide selectable power outputs at power bus 224 to selectable power interface 215. Selectable power interface 215 allows selection of either onboard power (e.g., power from within testing subsystem 206) or external power (e.g., from power bus 224).

Frequency source 209 may be controlled by GPIB controller 202 to provide selectable signals to testing subsystem 206 via clock interface 225. Selectable clock interface 216 allows selection between onboard clock signals (e.g., clock signals generated within testing subsystem 206) and external clock signals (e.g., clock signals provided via clock interface 225). Selectable power interface 215 may be configured to provide power to DUT chipset 214. Selectable clock interface 216 may be configured to provide clock signals to DUT chipset 214. Voltage, current, and temperature monitoring circuit 213 may be configured to monitor the voltage, current, and temperature parameters of DUT chipset 214. SPI 210 and system control bus 211 may be used to communicate information with DUT chipset 214 and control testing operations within testing subsystem 206. PCMCIA interface 218, SCB controller 203, serial interface 221, SPI 210, bus 222, and system control bus 211 may be used to provide communication capability similar to any one or more of serial links 130, 131, 134, and 135 of FIG. 1.

Figure 3:
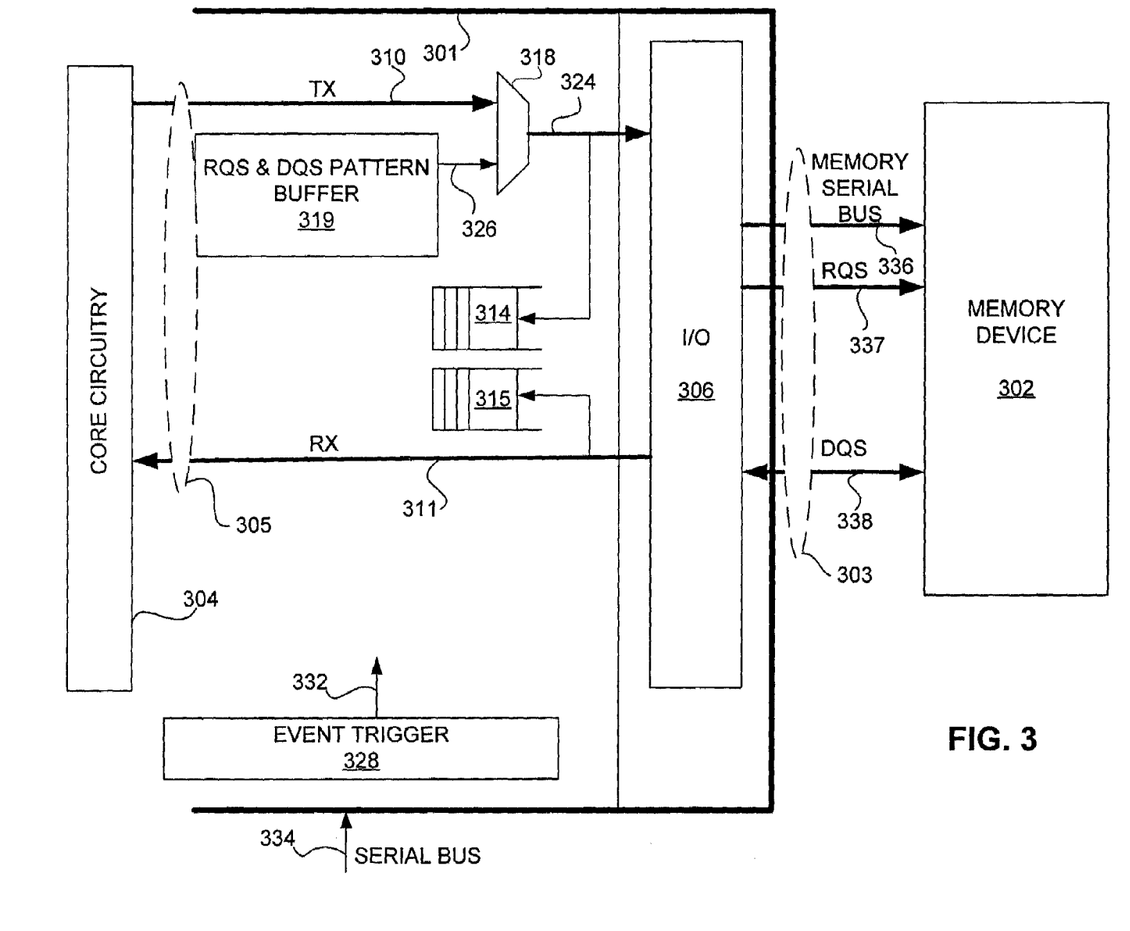
FIG. 3 is a block diagram illustrating a memory system configured to allow interconnect testing in accordance with an embodiment of the present invention.

FIG. 3 is a block diagram illustrating a memory system configured to allow interconnect testing in accordance with an embodiment of the present invention. The memory system of FIG. 3 comprises memory controller 301, memory device 302, and interconnection 303, which couples memory controller 301 to memory device 302. Interconnection 303 comprises serial link 336, control bus 337, and data bus 338. Memory controller 301 comprises core circuitry 304, interface circuitry 306, and communication path 305, which couples core circuitry 304 to interface circuitry 306. Interface circuitry 306 couples memory controller 301 to interconnection 303.

In at least one embodiment of the present invention, communication path 305 comprises transmit communication path 310 and receive communication path 311. In some embodiments, transmit communication path 310 comprises multiplexer 318. Multiplexer 318 produces output 324, which is a continuation of transmit communication path 310. Core circuitry 304 is coupled to transmit communication path 310, which is coupled, in those instances via multiplexer 318 and output 324, to interface circuitry 306. Interface circuitry 306 is coupled to receive communication path 311, which is coupled to core circuitry 304. Multiplexer 318 is configured to select between inputs comprising transmit communication path 310 and input 326, which is coupled to and receives a pattern from pattern buffer 319. Output 324, or in the absence of multiplexer 318, transmit communication path 310, is coupled to transmit capture buffer 314. Receive communication path 311 is coupled to receive capture buffer 315.

In at least one embodiment of the present invention, memory controller 301 further comprises event trigger circuitry 328, which provides control signal 332 to one or more of multiplexer 318, transmit capture buffer 314, and receive capture buffer 315. Event trigger circuitry 328 is configured to allow operation of multiplexer 318, transmit capture buffer 314, and/or receive capture buffer 315 to enable interconnection testing. Control of event trigger circuitry may be accomplished, for example, via serial link 334, which is coupled to memory controller 301.

Figure 4:
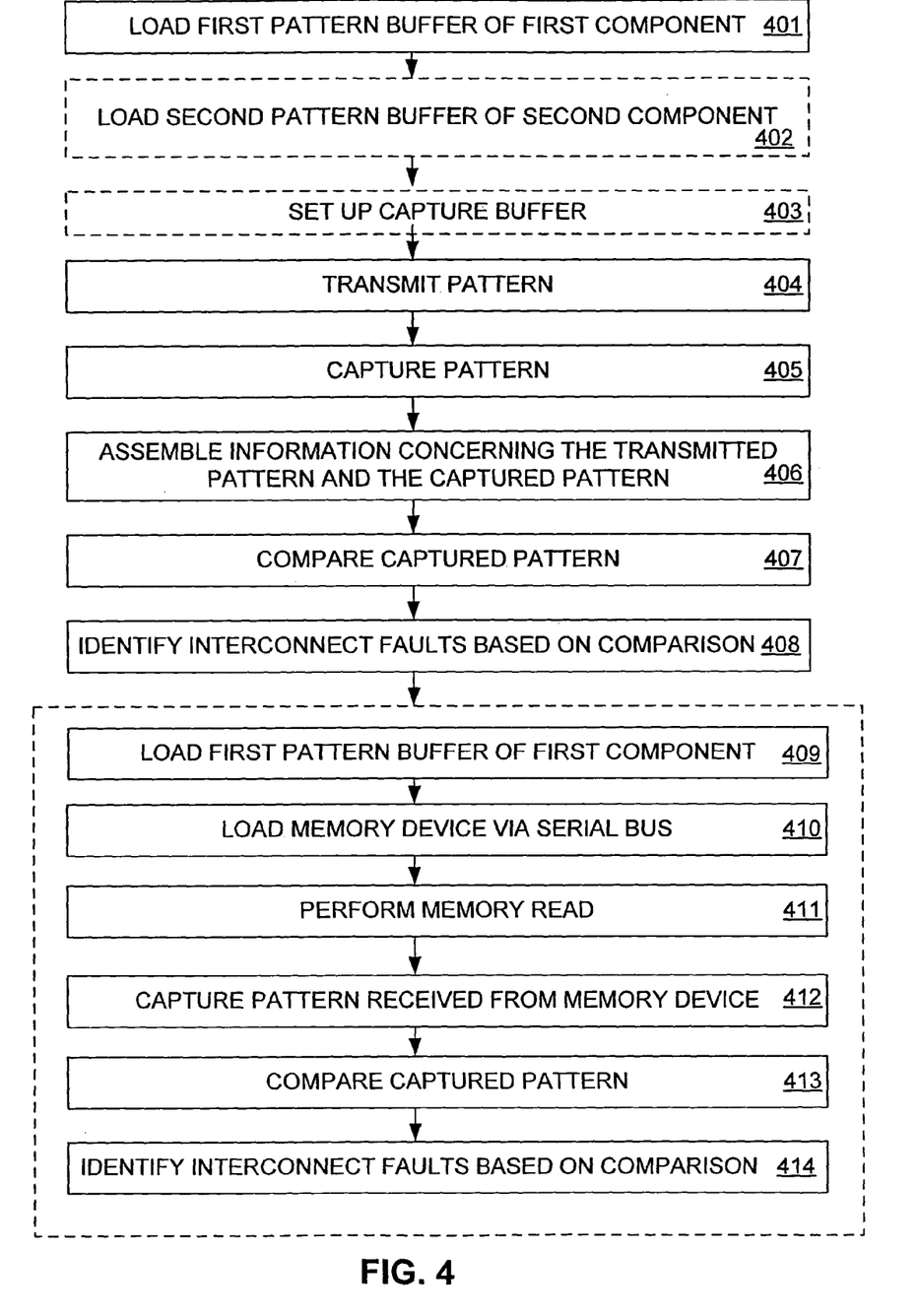
FIG. 4 is a flow diagram illustrating a method for interconnection testing in accordance with at least one embodiment of the present invention.

FIG. 4 is a flow diagram illustrating a method for interconnection testing in accordance with at least one embodiment of the present invention. The method begins by loading a first component pattern buffer, where the first component may, for example, be a controller, in step 401. Optional Step 402 comprises loading a second component pattern buffer, where the second component may be a system component other than the first component, for example, a graphics processor. Optional Step 403 comprises setting up a capture buffer to receive a pattern. Step 404 comprises transmitting a pattern. In at least one embodiment of the present invention, the pattern is transmitted from a pattern buffer. Step 405 comprises capturing the pattern. In at least one embodiment of the present invention, the pattern is captured in a receive capture buffer. In at least one embodiment involving a memory system, the pattern is captured in a memory device.

Step 406 comprises assembling information concerning the transmitted pattern and the captured pattern. In at least one embodiment of the present invention, Step 406 involves communicating the captured pattern back to the component that transmitted the transmitted pattern. Optionally, other information sufficiently representative of the captured pattern may be communicated back to the component that transmitted the transmitted pattern, for example, an encrypted form or condensed representation of the captured pattern may be communicated. Examples of such a condensed representation include CRC values and other check sum information. In at least one embodiment of the present invention, the transmitted pattern may be communicated to a component holding the captured pattern. Optionally, an encrypted or condensed version of the transmitted pattern may be communicated. In at least one embodiment of the present invention, information concerning both the transmitted pattern and the captured pattern may be communicated to yet another component.

Step 407 comprises comparing the captured pattern to the transmitted pattern. Optionally, information concerning the transmitted pattern, such as an encrypted or condensed version thereof, may be compared to information concerning the captured pattern, such as an encrypted or condenses version thereof. Step 408 comprises identifying interconnect faults based on the comparison. Inferences may be made from any differences identified based on comparison of the captured pattern to the transmitted pattern.

For example, if the pattern is communicated over a parallel bus and one bit of the captured pattern always remains zero, regardless of the value of the corresponding bit of the transmitted pattern and the values of other bits of the transmitted pattern, it may be inferred that the portion of the interconnect corresponding to the bit that remains zero is shorted to ground. Likewise, it may be inferred that a portion of the interconnection corresponding to a bit that always remains one, regardless of the values of bits of the transmitted pattern, is shorted to a supply voltage or other high logic level. As another example, if the value of at least one bit of the captured pattern appears to have some dependents on the value of a bit of the transmitted pattern other than the corresponding bit of the transmitted pattern, it may be inferred that the portion of the interconnection that corresponds to the bit that exhibits the dependence is shorted to another portion of the interconnection that corresponds to the other bit or bits.

One or more embodiments of the present invention further comprise Steps 409 through 414. Step 409 comprises loading a second pattern into the first controller pattern buffer. The second pattern may be similar to or different from the pattern loaded in Step 401. Step 410 comprises loading the second pattern into a memory device via a serial link. Step 411 comprises performing a memory read operation. Step 412 comprises capturing a second received pattern received from the memory device. Step 413 comprises comparing the second captured pattern with the second pattern loaded into the memory device via the serial link in Step 410. Step 414 comprises identifying any interconnect faults based on the comparison of Step 413. It should be noted that at least one embodiment of the method of FIG. 4 may be practiced with any two or more system components, for example, any two integrated circuit devices.

Figure 5:
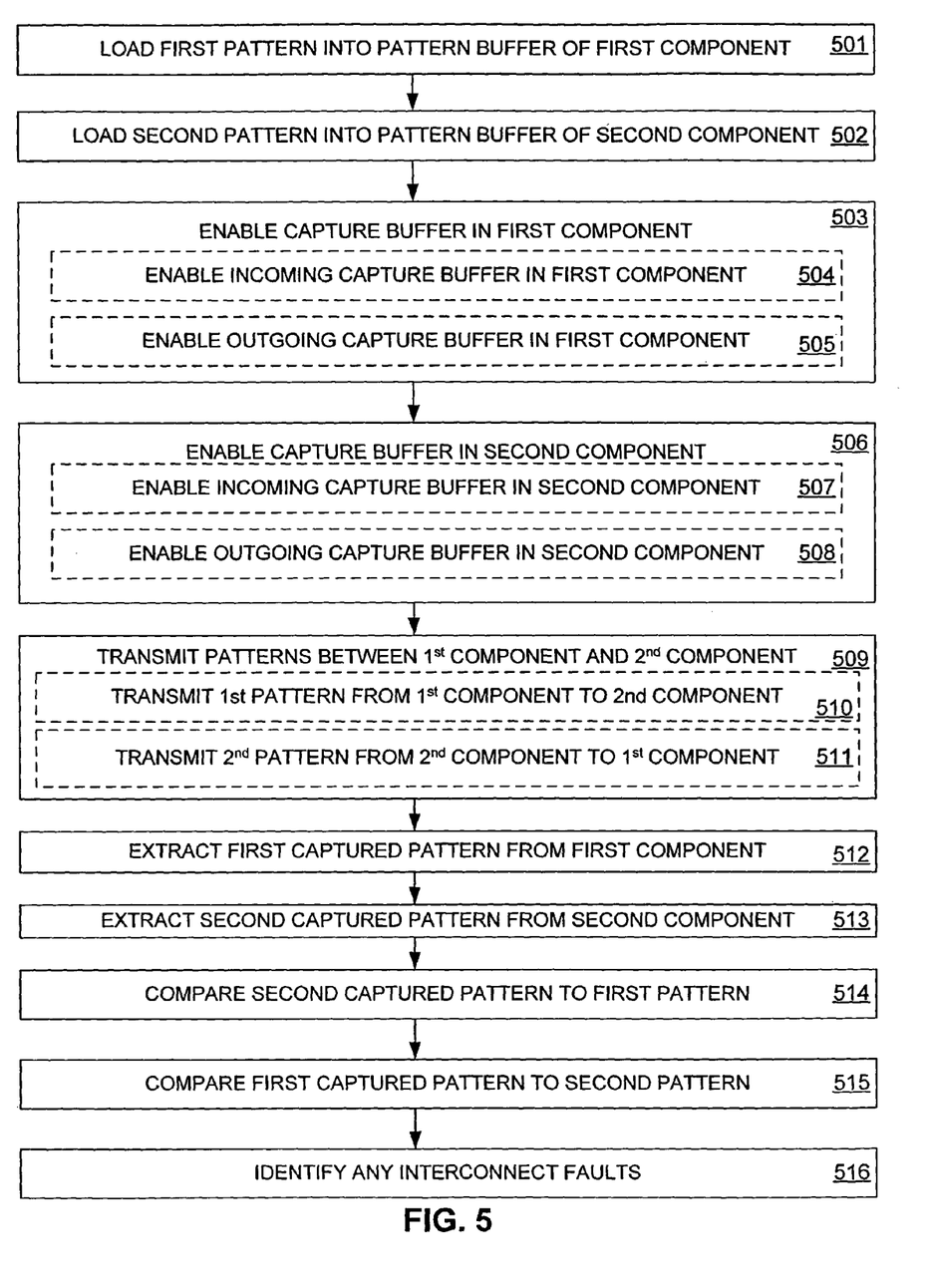
FIG. 5 is a flow diagram illustrating a method in accordance with an embodiment of the present invention.

FIG. 5 is a flow diagram illustrating a method in accordance with an embodiment of the present invention. Step 501 comprises loading a first pattern into a pattern buffer of a first component. Step 502 comprises loading a second pattern into a pattern buffer of a second component. Step 503 comprises enabling a capture buffer in the first component. Step 503 may include Steps 504 and/or 505. Step 504 comprises enabling an incoming capture buffer in the first component. Step 505 enabling an outgoing capture buffer in the first component. Step 506 comprises enabling a capture buffer in the second component. Step 506 may include Steps 507 and/or 508. Step 507 comprises enabling an incoming capture buffer in a second component. Step 508 comprises enabling an outgoing capture buffer in the second component. Step 509 comprises transmitting patterns between a first component and a second component. Step 509 may include Steps 510 and/or 511. Step 510 comprises transmitting a first pattern from the first component to the second component. Step 511 comprises transmitting the second pattern from the second component to the first component. Step 512 comprises extracting a first captured pattern from the first component. Step 513 comprises extracting a second captured pattern from the second component. Step 514 comprises comparing the second captured pattern to the first pattern. Step 515 comprises comparing the first captured pattern to the second pattern. Step 516 comprises identifying any interconnect faults. The interconnect faults may be identified based on the comparisons performed in Steps 514 and/or 515.

Figure 6:
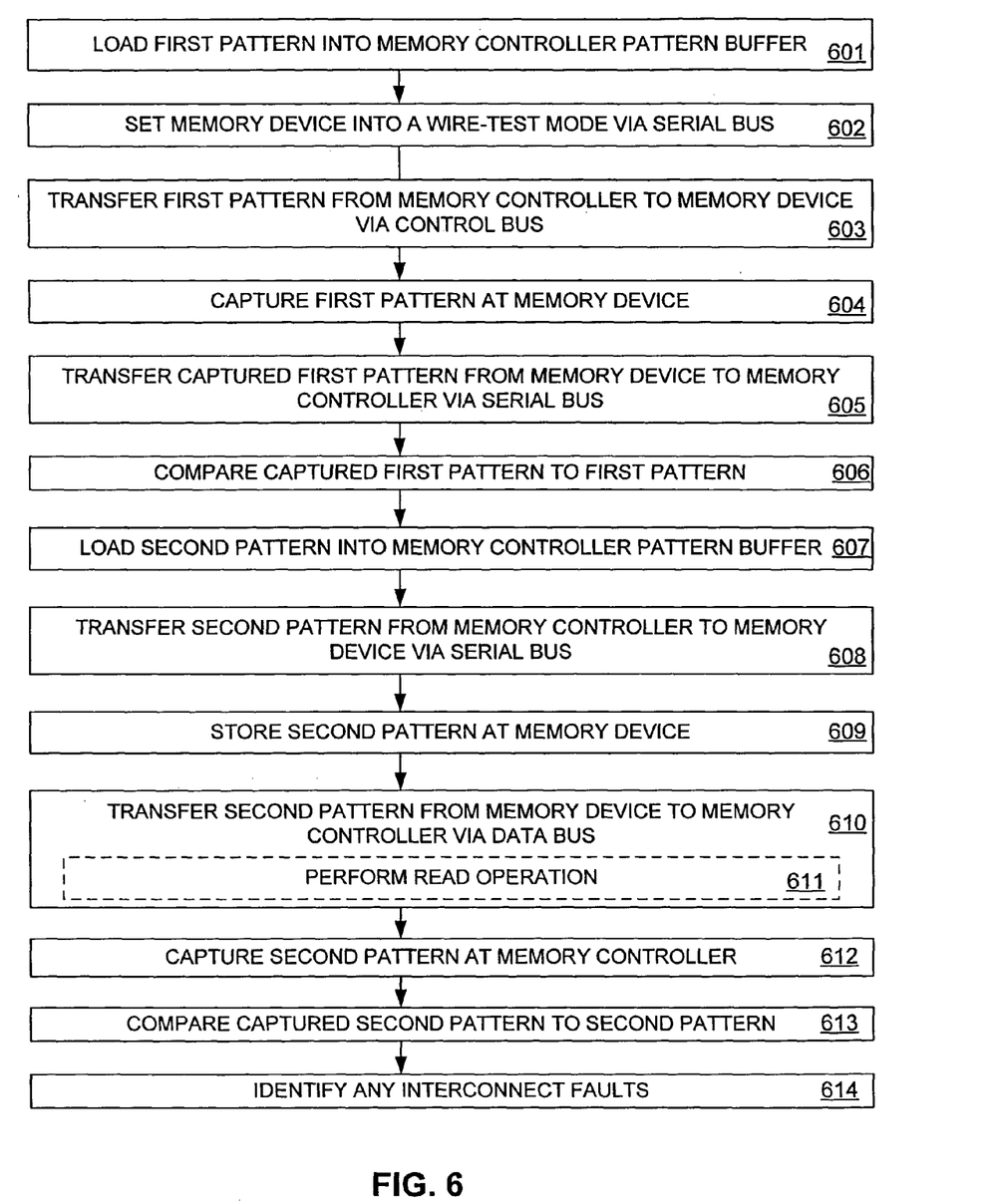
FIG. 6 is a flow diagram illustrating a method in accordance with an embodiment of the present invention.

FIG. 6 is a flow diagram illustrating a method in accordance with an embodiment of the present invention. Step 601 comprises loading a first pattern into a memory controller pattern buffer. Step 602 comprises setting a memory device into a wire test mode via a serial link. Step 603 comprises transferring the first pattern from the memory controller to the memory device via a control bus. Step 604 comprises capturing the first pattern at the memory device. Step 605 comprises transferring the captured first pattern from the memory device to the memory controller via the serial link. Step 606 comprises comparing the captured first pattern to the first pattern that was transferred in Step 603.

Step 607 comprises loading a second pattern into the memory controller pattern buffer. A second pattern may be similar to or different from the first pattern. If the second pattern is similar to the first pattern and the first pattern is retained in the memory controller pattern buffer, Step 607 may be omitted. Step 608 comprises transferring the second pattern from the memory controller to the memory device via the serial link. Step 609 comprises storing the second pattern at the memory device. Step 610 comprises transferring the second pattern from the memory device to the memory controller via a data bus. Step 610 may include Step 611. Step 611 comprises performing a read operation to transfer the second pattern from the memory device to the memory controller via the data bus. Step 612 comprises capturing the second pattern at the memory controller. Step 613 comprises comparing the captured second pattern to the second pattern that was transferred in Step 608. Step 614 comprises identifying any interconnect faults. Interconnect faults may be identified based on the comparison performed in Step 613.

In one or more embodiments of the present invention, information pertaining to the captured pattern may be assessed in any of a variety of ways. For example, information pertaining to the captured pattern may be compared to imbedded information stored in permanent memory, such as read only memory (ROM), programmable read only memory (PROM), erasable programmable read only memory (EPROM), electrically erasable programmable read only memory (EEPROM), electrically alterable programmable read only memory (EAPROM), FLASH memory, or other permanent or semi-permanent memory. As another example, information pertaining to the captured pattern may be compared to preloaded information that is loaded prior to capturing the captured pattern and is ready for comparison with the captured pattern or information relating thereto after the captured pattern has been captured. As another example, information relating to the captured pattern may be compared to information loaded for comparison after the captured pattern has been captured.

As another example, information relating to the captured pattern may be compared to encrypted or condensed information representative of the pattern being used for testing. Examples of encrypted information representative of the pattern being used for testing include both forms of encryption that may be decrypted to obtain the original pattern being used for testing and forms of one-way encryption for which decryption is not provided. Examples of condensed information representative of the pattern being used for testing include CRC values and other check sum values.

As another example, comparison of information pertaining to the captured pattern may be performed as part of a built-in self-test (BIST) process. In such a case, information pertaining to the captured pattern may be compared to other information used during the BIST process that relates back to the pattern being used for testing. As another example, a sequence of deterministic patterns may be used for testing. For example, a value represented by a pattern, such as a binary value, may be incremented or decremented to generate each successive pattern. As sequence of deterministic patterns could also be generated using a predictable coding, such as a gray code may be used. Use of a sequence of deterministic patterns allows that sequence to be generated both at a point in the system prior to transmission over the interconnect being tested and, optionally, at a point in the system where the pattern can be compared to the captured pattern. As yet a further example, information pertaining to a current captured pattern may be compared to information derived from a previously captured pattern. As a further example, a static testing pattern may be used, allowing the captured pattern to always be compared to the same standard.

In accordance with at least one embodiment of the present invention, testing may be performed on a variety of types of interconnections. For example, interconnections may include any type of medium or media supporting electromagnetic communication. More specific examples include radio frequency (RF) interconnections, wireless interconnections, ultrawideband (UWB) interconnections, optical interconnections, but, in at least one preferred embodiment, include electrically conductive interconnections.

In accordance with at least one embodiment of the present invention, various paths may exist between devices. For example, such paths may include one or more serial links and/or one or more parallel buses. Such paths may communicate signals in a variety of ways. For example, signals may be communicated as a current, a voltage relative to some reference, such as a ground voltage, a differential voltage, or in another form. Other forms may be applicable to other types of media. For example, a signal may be represented by a magnitude of electromagnetic energy, or by modulating the signal using some form of modulation, such as amplitude modulation, frequency modulation, phase modulation, pulse modulation, pulse coded modulation, or some other form of modulation.

While at least one embodiment of the present invention described herein has a point-to-point architecture (i.e., a direct connection between two components), the present invention may also be practiced with a variety of types of architectures. For example, one or more first components may be coupled to one or more second components via one or more point-to-point and/or one or more multidrop buses. A multidrop bus provides for the ability to connection more than two components via such a bus. With either point-to-point connections or multidrop connections, numerous configurations are possible. For example, one first component or component of a first type may be coupled to one second component or component of a second type by a point-to-point interconnection. As another example, a plurality of first components or components of a first type may be coupled to one second component or component of a second type via a multidrop interconnection, a plurality of point-to-point interconnections, or a combination thereof. As a further example, a first component or a component of a first type may be coupled to a plurality of second components or components of a second type via a multidrop interconnection, a plurality of point-to-point interconnections, or a combination thereof. As yet another example, a plurality of first components or components of a first type may be coupled to a plurality of second components or components of a second type via one or more multidrop interconnections, a plurality of point-to-point interconnections, or a combination thereof.

In accordance with at least one embodiment of the present invention, a method and apparatus for interconnect testing advantageously utilizes the diversity of multiple interconnections between components to identify and isolate interconnect faults within those multiple interconnections. For example, between devices that are coupled by two or more paths, such as buses or links, which may include serial links and/or parallel buses, a testing pattern or information related thereto may be communicated from a first component to a second component over a first bus and the testing pattern or information related thereto may be communicated from the second component to the first component over a second bus, thereby allowing comparison of the results of communication over the diverse paths to occur at the first component. As another example, the testing pattern or information related thereto may be communicated from the first component to the second component over the first bus, and the testing pattern or information related thereto may be communicated from the first component to the second component over the second bus, allowing comparison based on communication over the diverse paths to occur at the second component.

In accordance with one or more embodiments of the present invention, the techniques described herein may be applied for testing between integrated circuits on a circuit board. Such a circuit board may include a printed circuit board, a subset thereof, such as a multi-chip module, or a superset thereof, such as a system comprising multiple interconnected circuit boards. As another example, one or more embodiments of the present invention may be practiced with a memory system comprising a controller and one or more memory devices and may be used to test interconnections between the controller and the one or more memory devices. As another example, one or more embodiments of the present invention may be used to test components linked by a serial link.

Depending on the number of interconnections provided between components, the advantages of the diversity of communication over the several interconnections may be utilized to sequentially test the various interconnections. For example, a serial link may be initially tested, then used to test a parallel bus, for example by transmitting the pattern in one direction over the serial link and the in the opposite direction over the parallel bus. Likewise, multiple serial links or multiple parallel buses may also be tested. By confirming the integrity of each bus in sequence, a bus exhibiting an interconnect fault may be accurately identified. Even if multiple paths between components are not available, one or more embodiments of the present invention may be used to identify and isolate any interconnect faults within the bus that exists between the components. For example, by communicating the pattern over the bus in one direction, altering the pattern, then communicating the pattern over the bus in the opposite direction, the specific nature of any interconnect faults present may be identified and isolated. For example, by transposing the bit order between the transmission of the pattern in one direction and in the other direction, and by performing multiple tests using different patterns or different transpositions, the precise nature of any interconnect fault present can be determined.

Another advantage of the diversity of using both a serial link and a parallel bus for testing is that errors that affect only a serial or parallel bus may be identified. For example, timing errors or waveform distortion errors, such as errors induced by over shoot or under shoot that might occur on a serial link may be identified. Likewise, errors such as pattern-induced errors that arise as a result of certain combinations of bits being present on a parallel bus may be identified. By performing multiple testing cycles and varying the testing patterns used, testing patterns tailored to identify a particular type of fault for a particular type of bus may be generated and used to identify the specific nature of the faults and its location.

In accordance with one or more embodiments of the present invention, testing may be performed using a buffer width equal to or greater than the bus width of the interconnections or, a buffer having a buffer width of less than the bus width may be used. For example, a buffer, such as a pattern buffer or capture buffer, having a buffer width of less than the bus width may be multiplexed onto the bus such that multiple testing cycles may be performed to test the entire bus width. Such multiple testing cycles may be performed using the same pattern or different patterns.

One or more embodiments of the present invention may be practiced in a manner that does not introduce additional components that would cause performance limitations within the system being tested. Consequently, both testing and normal operation of the system may be conducted using the same performance parameters, thereby maximizing performance. By being able to perform testing at the full speed at which the components under test normally operation (i.e., "at speed" testing), a valid assessment of the performance of the system may be made. Not only may direct current (DC) interconnect faults, such as opens or shorts, be identified, but AC performance characteristics may also be observed. For example, by performing testing using patterns communicated so as to have similar AC characteristics as information communicated during normal operation, even interconnect faults involving complex impedances may be identified. For example, reactive interconnect faults, such as capacitive or inductive interconnect faults may be identified. An example of such a fault would include an excessive parasitic capacitance that might interfere with high frequency communication between components.

In accordance with one or more embodiments of the present invention, similar or different timing may be used to transmit and capture the pattern being used for testing. For example, a capture buffer may capture more than one sample for each transition of the transmitted pattern. As an example, by causing the capture buffer to sample at a high rate, dynamic disturbances, such as overshoot and undershoot, following a transition of the transmitted pattern may be observed. By adjusting the timing and frequency of transmission and sampling of the pattern, a time domain analysis may be performed, for example to yield information of the sort that might otherwise be obtained using time domain reflectometry techniques. Such a time domain analysis may be used to obtain a spatial characterization of the interconnection, for example allowing the location of a fault along an interconnection to be identified.

It should be noted that one advantage of time domain analysis in accordance with at least one embodiment of the present invention provides over traditional time domain reflectometry is that an actual measurement of the interconnect can be made using the actual circuitry coupled to that interconnect, rather than relying on external testing apparatus that may yield artificial test results. Time domain analysis may be performed by performing at speed interconnect testing using different patterns and accumulating capture pattern information so as to synthesize an eye diagram of the characteristics of the captured patterns. Set up and hold time characteristics may be observed in such an eye diagram by adjusting the timing used to transmit or capture the pattern, for example by adjusting a reference clock. An eye diagram maybe interpreted to identify interconnect faults. For example, if a conductive interconnect trace on a circuit board is over edged, the height of the eye would be smaller. If the conductive interconnect trace of the circuit board is under edged, the width of the eye would be smaller. Another advantage that may be provided over traditional time domain reflectometry techniques is that a large number of interconnect conductors may be analyzed simultaneously.

In accordance with the aspects of the invention described herein, one or more embodiments of the present invention may be used to identify a wide variety of different types of interconnection faults. These various types of faults may include open faults, short faults, power or ground faults, pattern-induced faults, AC-related faults, intermittent faults, as well as spatial characterizations thereof. For example, an open fault, such as a broken conductor or a conductor exhibiting abnormally high resistance, may be identified. As another example, a short fault, such as a conductor shorted to another conductor, such as another interconnect conductor, a ground conductor, a power conductor, or some other conductor. As another example, a power or ground fault may include faults arising from inadequate provision of power or ground, such as static or dynamic anomalies in power or ground conductors that affect the quality of the pattern as it is transmitted and/or received.

As another example, pattern-induced faults may arise when a particular combination of bits in a pattern tends to result in unreliable operation. As a further example, AC-related faults may include capacitive faults, such as those that may occur from improper spacing of circuit board traces, which may results from over etching or under etching of a circuit board. AC-related faults may also include inductive faults, as well as lossy dielectric faults. As yet another example, intermittent faults may include faults of a mechanical nature that can arise. For example, when a system or portion thereof is subjected to mechanical shock or vibration, as well as thermally related faults that may manifest themselves as temperatures change and materials expand or contract or properties of semiconductors are affected. Not only is the existence of such a wide variety of faults possible, but also, by implanting time domain analysis in accordance with one or more embodiments of the present invention, spatial characterization of such faults may be achieved, including determination of the location of a fault along the path of an interconnection.

According to one or more embodiments of the present invention, a pattern buffer may be implemented as either a register, which may be loaded with a value representing the pattern, or circuitry capable of generating multiple patterns over time, for example a pattern generator configured to generate multiple patterns over time or a first-in-first-out (FIFO) buffer which may be loaded with multiple patterns over time. Even in the case of a pattern buffer implemented as a single register, control circuitry may be provided to load the register with multiple patterns over time. Also, a capture buffer may be implemented as a register or as a circuit capable of receiving multiple patterns over time, such as a FIFO buffer. It should be noted that, with appropriate control logic, even a capture buffer implemented as a register may be used to receive multiple patterns over time, provided those patterns are retrieved from the capture buffer with adequate promptness.

In accordance with one or more embodiments of the present invention, methods and/or apparatuses described herein may be implemented in a manufacturing environment, for example to test a finished assembly before shipping, or to perform diagnosis of a defective item without the need to open the case and closing that item. Also, methods and apparatuses described herein may be used to test a system or a portion thereof during normal operation or in close temporal proximity thereto. For example, one or more embodiments of the present invention may be implemented to provide a BIST capability. Consequently, built-in self-testing may be conducted specifically on interconnects, as well as on other system components.

One or more embodiments of the present invention may be practiced to perform testing on any sort of interconnections. For example, any sort of interconnections between system components, such as integrated circuits, may be tested. As an example, interconnections on a printed circuit board between integrated circuits may be tested. As another example, interconnections across a cable may be tested. As another example, one or more embodiments of the present inventions may be applied to back plane testing to assure the integrity of a back plane to couple circuit boards within a system.

One or more embodiments of the present invention may be practiced to between similar and/or different types of system components. Control of system components may be centralized or distributed. For example, control circuitry to enable and coordinate one or more pattern buffers, one or more capture buffers, and one or more trigger circuits may be localized on one system component or may be distributed among two or more system components. One or more system components may be provided with a pattern buffer, a capture buffer, and trigger circuitry, while one or more other system components may omit one or more of a pattern buffer, a capture buffer, and a trigger buffer. For example, a system component that does not include a pattern buffer may not generate patterns by itself, but may rely on another system component to generate patterns.

It should be noted that, while a transmission capture buffer may be implemented, for example to be used for debugging purposes, one or more embodiments of the present invention may be practiced without the use of a transmit/capture buffer. Also, functionality of other components, such as a pattern buffer or a receive/capture buffer may be implemented within another portion of a system component, for example within core circuitry. In such cases, elements so implemented, need not be explicitly implemented as separate portions within the system component. Even so, embodiments of the present invention may be practiced without altering interface circuitry of the system component in a manner that would impair the performance of that system component.

Accordingly, a method and apparatus for performing testing of interconnections between components of a system has been described. It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A method for performing testing of an interconnect between components of a system comprising the steps of:
   loading a first pattern into a controller pattern buffer of a controller;
   transmitting the first pattern from the controller to a component of the components over a first interconnect;
   receiving at the controller from the component, via a second interconnect distinct from the first interconnect, a captured first pattern corresponding to the first pattern;
   performing at the controller a first comparison to compare the captured first pattern to the first pattern; and
   identifying any interconnect faults based on the first comparison.

2. The method of claim 1 further comprising the step of preparing the component capture buffer to capture the transmitted first pattern.

3. The method of claim 2 wherein the step of preparing the component capture buffer further comprises the step of placing the component in an interconnect test mode.

4. The method of claim 3 wherein the component is a memory device.

5. The method of claim 4 further comprising the step of transferring the captured first pattern from the component capture buffer to the controller.

6. The method of claim 5 wherein the step of transferring the captured first pattern is performed via a serial link.

7. The method of claim 6 wherein the step of transmitting the first pattern is performed via a control bus.

8. The method of claim 7 further comprising the step of loading a second pattern into the memory device via a serial link;
   performing a memory read operation;
   capturing the second pattern received from the memory device;
   performing a second comparison to compare the captured second pattern to the second pattern; and
   identifying any interconnect faults based on the second comparison.

9. The method of claim 8 wherein the step of performing the memory read operation is performed via a control bus.

10. The method of claim 9 wherein the step of capturing the second pattern is performed by capturing the second pattern received from the memory device via a data bus.

11. The method of claim 10 further comprising the step of loading the second pattern into the controller pattern buffer of the controller.

12. The method of claim 10 wherein the second pattern is identical to the first pattern.

13. The method of claim 2 further comprising the steps of:
    loading a second pattern into a component pattern buffer of the component;
    transmitting the second pattern to the controller;
    capturing the transmitted second pattern in a controller capture buffer of the controller; and
    performing a second comparison to compare the captured second pattern to the second pattern, wherein the step of identifying any interconnect faults is based on the first comparison and the second comparison.

14. The method of claim 13 wherein the step of loading the second pattern is performed via a serial link.

15. The method of claim 13 wherein the step of loading the second pattern is performed by loading a stored pattern from an embedded memory element of the component.

16. The method of claim 13 wherein the component is a graphics processor.

17. The method of claim 13 wherein the second pattern is identical to the first pattern.

18. The method of claim 1, wherein the first interconnect is a parallel interconnect and the second interconnect is a serial interconnect.

19. A system configured to facilitate interconnect testing comprising:
- a first component comprising first core circuitry, first interface circuitry, a pattern buffer configured to store a pattern, and a first communication path coupling the first core circuitry to the first interface circuitry;
- a second component comprising second core circuitry, second interface circuitry, and a second communication path coupling the second core circuitry to the second interface circuitry, and interconnect circuitry coupling the first component to the second component, wherein a capture buffer is coupled to the first communication path for capturing the pattern transmitted by the first component via the interconnect circuitry as a captured pattern; and
- a link between the second component and the first component, where the link is distinct from the interconnect circuitry and is configured to transfer the captured pattern from the second component to the first component for comparison with the pattern.

20. The system of claim 19 wherein a second capture buffer is coupled to the second communication path.

21. The system of claim 20 wherein the first communication path comprises a first transmit path and a first receive path, wherein the first capture buffer comprises a first transmit capture buffer coupled to the first transmit communication path and a first receive buffer coupled to the first receive communication path.

22. The system of claim 21 wherein the second communication path further comprises a second transmit communication path and a second receive communication path, wherein the second capture buffer further comprises a second transmit capture buffer coupled to the second transmit communication path and a second receive capture buffer coupled to the second receive communication path.

23. The system of claim 22 wherein the first transmit communication path further comprises a first multiplexer, the first multiplexer configured to select between a first input from the first core circuitry and a second input from a first pattern buffer coupled to the multiplexer.

24. The system of claim 23 wherein the second transmit communication path further comprises a second multiplexer configured to select between a third input coupled to the second core circuitry and a fourth input coupled to a second pattern buffer coupled to the multiplexer.

25. The system of claim 23 further comprising a serial link coupling the first component to the second component, wherein the first component is configured to allow communication of first data in the first receive capture buffer to the second component via the serial link.

26. The system of claim 23 further comprising a serial link coupling the first component to the second component, wherein the second component is configured to allow communication of second data in the second receive capture buffer to the first component via the serial link.

27. The system of claim 23 further comprising a serial link coupling the first component to the second component, wherein the first component is configured to allow communication of the first pattern from the first transmit capture buffer to the second component via the serial link.

28. The system of claim 23 further comprising a serial link coupling the first component to the second component, wherein the second component is configured to allow communication of the second pattern from the second transmit capture buffer to the first component via the serial link.

29. A memory system configured to allow interconnect testing comprising: a memory controller comprising a controller pattern buffer configured to store a pattern;
- a memory device coupled to the memory controller, wherein the memory controller comprises core circuitry, interface circuitry, and a communication path coupling the core circuitry to the interface circuitry, wherein a capture buffer is coupled to the communication path for capturing the pattern transmitted by the memory controller as a captured pattern;
- interconnect circuitry between the memory device and the memory controller, where the interconnect circuitry is configured to transfer the pattern from the memory controller to the memory device; and
- a link between the memory device and the memory controller, where the link is distinct from the interconnect circuitry and is configured to transfer the captured pattern from the memory to the memory controller for comparison with the pattern.

30. The memory system of claim 29 wherein the communication path comprises a transmit communication path and a receive communication path, wherein the capture buffer comprises a transmit capture buffer coupled to the transmit communication path and a receive capture buffer coupled to the receive communication path.

31. The memory system of claim 30 wherein the transmit communication path comprises a multiplexer configured to select between a first input coupled to the core circuitry and a second input coupled to a pattern buffer.

32. The memory system of claim 29 wherein the memory device is coupled to the memory controller via a memory serial link, a control bus, and a data bus.

33. A system configured to facilitate interconnect testing comprising:
- a first component comprising first core circuitry, first interface circuitry, a means for storing a test pattern, and a first communication means for coupling the first core circuitry to the first interface circuitry;
- a second component comprising second core circuitry, second interface circuitry, and a second communication means for coupling the core circuitry to the interface circuitry, and interconnection means for coupling the first component to the second component, wherein a means for capturing the test pattern received from the first component is coupled to the first communication means; and
- a link means between the second component and the first component, where the link means is distinct from the interconnection means and is configured to transfer the captured test pattern from the second component to the first component for comparison with the test pattern.

34. A method for performing testing of an interconnect between components of a system comprising the steps of:
- storing a first pattern in a controller;
- transmitting the first pattern from the controller to a component of the components over a first interconnect;
- receiving at the controller from the component, via a second interconnect distinct from the first interconnect, a captured first pattern corresponding to the first pattern;
- performing at the controller a first comparison to compare the captured first pattern to the first pattern;
- transmitting a second pattern from the controller to the component via the second interconnect;
- receiving at the controller from the component, via the first interconnect, a captured second pattern corresponding to the second pattern;

performing at the controller a second comparison to compare the captured second pattern to the second pattern;

identifying any interconnect faults of the first interconnect based on the first comparison and the second comparison.

35. A method for performing testing of an interconnect between components of a system comprising the steps of:

storing a first pattern in a controller;

transmitting the first pattern from the controller to a component of the components over a first interconnect;

receiving at the controller from the component, via a second interconnect distinct from the first interconnect, a captured first pattern corresponding to the first pattern;

performing at the controller a first comparison to compare the captured first pattern to the first pattern;

receiving at the controller from the component, via the first interconnect, a captured second pattern corresponding to a second pattern stored in an embedded memory element of the component;

performing at the controller a second comparison to compare the captured second pattern to a copy of the second pattern stored in an embedded memory element of the controller;

identifying any interconnect faults of the first interconnect based on the first comparison and the second comparison.

* * * * *

UNITED STATES PATENT AND TRADEMARK OFFICE
CERTIFICATE OF CORRECTION

PATENT NO. : 7,031,868 B2 Page 1 of 1
APPLICATION NO. : 10/663572
DATED : April 18, 2006
INVENTOR(S) : Yeung It is certified that error appears in the above-identified patent and that said Letters Patent is hereby corrected as shown below:

In the Claims:

Column 14, claim 2, line 12, please delete the first occurrence of "the" and insert --a--.

Column 14, claim 7, line 26, please delete "step" and insert --steps--.

Signed and Sealed this

Twenty-sixth Day of June, 2007

JON W. DUDAS
*Director of the United States Patent and Trademark Office*